United States Patent
Ellis (10) Patent No.: US 10,366,936 B2
(45) Date of Patent: Jul. 30, 2019

(54) ELECTRONIC DEVICE COMPONENT WITH AN INTEGRAL DIAMOND HEAT SPREADER

(71) Applicant: Element Six Technologies Limited, Oxfordshire (GB)

(72) Inventor: Julian James Sargood Ellis, Oxfordshire (GB)

(73) Assignee: Element Six Technologies Limited (GB)

( * ) Notice: Subject to any disclaimer, the term of this patent is extended or adjusted under 35 U.S.C. 154(b) by 0 days.

(21) Appl. No.: 15/316,788

(22) PCT Filed: Jun. 10, 2015

(86) PCT No.: PCT/EP2015/062948
§ 371 (c)(1),
(2) Date: Dec. 6, 2016

(87) PCT Pub. No.: WO2015/193153
PCT Pub. Date: Dec. 23, 2015

(65) Prior Publication Data
US 2017/0162467 A1    Jun. 8, 2017

(30) Foreign Application Priority Data

Jun. 18, 2014 (GB) .................................... 1410843.5
Oct. 13, 2014 (GB) .................................... 1418060.8

(51) Int. Cl.
*H01L 21/48*     (2006.01)
*H01L 23/373*    (2006.01)
(Continued)

(52) U.S. Cl.
CPC ...... *H01L 23/3732* (2013.01); *H01L 21/4807* (2013.01); *H01L 21/4882* (2013.01);
(Continued)

(58) Field of Classification Search
CPC ............. H01L 23/3732; H01L 23/3675; H01L 23/3731; H01L 23/3121; H01L 24/49;
(Continued)

(56) References Cited

U.S. PATENT DOCUMENTS 4,360,965 A * 11/1982 Fujiwara ............. H01L 23/3732
                                                     228/123.1
5,642,261 A *  6/1997 Bond .................. H01L 23/3128
                                                     257/707
(Continued)

FOREIGN PATENT DOCUMENTS

CN       202003978       10/2011
DE     19735074 A1        9/1998
(Continued)

OTHER PUBLICATIONS

Grant Lu, "CVD Diamond Electronic Packaging Applications", Institute of Electrical and Electronics Engineers, May 10, 1994, Electro International '94. Boston. pp. 836-839.
(Continued)

*Primary Examiner* — Ahmed N Sefer
(74) *Attorney, Agent, or Firm* — Bryan Cave Leighton Paisner LLP (57) ABSTRACT

An electronic device component comprising:
  a support frame comprising a top surface, a bottom surface, and an opening extending between the top surface and bottom surface of the support frame;
  a diamond heat spreader comprising a wafer of synthetic diamond material having a top face, a bottom face, wherein the diamond heat spreader is bonded to the support frame so that the diamond heat spreader extends across the opening in the support frame; and
  one or more semiconductor components mounted on, and bonded to, the top face of the diamond heat spreader,
(Continued)

wherein the support frame is formed of an electrically insulating ceramic material to which the diamond heat spreader is bonded.

13 Claims, 3 Drawing Sheets

(51) Int. Cl.
  *H01L 23/367* (2006.01)
  *H01L 23/31* (2006.01)
  *H01L 23/00* (2006.01)
  *H01L 25/065* (2006.01)

(52) U.S. Cl.
  CPC ...... *H01L 23/3121* (2013.01); *H01L 23/3675* (2013.01); *H01L 23/3677* (2013.01); *H01L 23/3731* (2013.01); *H01L 24/32* (2013.01); *H01L 24/49* (2013.01); *H01L 25/0655* (2013.01); *H01L 25/0657* (2013.01); *H01L 24/48* (2013.01); *H01L 2224/48091* (2013.01); *H01L 2224/73265* (2013.01); *H01L 2924/0002* (2013.01); *H01L 2924/00014* (2013.01); *H01L 2924/16152* (2013.01)

(58) Field of Classification Search
  CPC ............. H01L 25/0657; H01L 25/0655; H01L 21/4807; H01L 21/4882; H01L 24/32; H01L 2224/48091; H01L 2224/73265
  See application file for complete search history.

(56) References Cited

U.S. PATENT DOCUMENTS

| | | | |
|---|---|---|---|
| 6,489,634 B1 | 12/2002 | Schaffer et al. | |
| 6,534,792 B1 | 3/2003 | Schaffer | |
| 8,829,362 B2 | 9/2014 | Masuda | |
| 2002/0196610 A1 | 12/2002 | Beuille et al. | |
| 2013/0081867 A1 | 4/2013 | Masuda | |
| 2014/0196934 A1* | 7/2014 | Kawagoe | H05K 1/0209 174/252 |
| 2014/0339684 A1* | 11/2014 | Mollart | H01L 21/02527 257/632 |
| 2015/0136357 A1* | 5/2015 | Johnson | H01L 23/3677 165/80.3 |
| 2015/0334877 A1* | 11/2015 | Kawagoe | H01L 25/167 361/709 |

FOREIGN PATENT DOCUMENTS

| | | |
|---|---|---|
| EP | 0690500 A1 | 1/1996 |
| EP | 2575167 A2 | 4/2013 |
| JP | 2012-222331 | 11/2012 |
| JP | 2013077746 A | 4/2013 |
| WO | 2001/78109 A2 | 10/2001 |
| WO | 2013/015073 A1 | 1/2013 |
| WO | WO 2013/015073 * | 1/2013 |

OTHER PUBLICATIONS

International Search Report for PCT/EP2015/062948 dated Sep. 21, 2015.
Combined Search and Examination report for GB1510079.5 dated Dec. 17, 2015.

* cited by examiner

ELECTRONIC DEVICE COMPONENT WITH AN INTEGRAL DIAMOND HEAT SPREADER

FIELD OF INVENTION

The present invention relates to an electronic device component with an integral diamond heat spreader. Embodiments of the present invention address the problem of providing an electronic device component which is compact in size, provides good heat spreading and/or heat sinking capability, and is particularly suited for mounting into a range of different electronic device configurations to maximize its flexibility and usefulness in a range of electronic device types, configurations, and applications. Furthermore, embodiments of the present invention enable a reduction in the size of semiconductor die components and semiconductor die modules through the use of high quality polycrystalline CVD synthetic diamond material or single crystal synthetic diamond material, for example single crystal CVD synthetic diamond material, mounted in close thermal contact with the semiconductor die components leading to more effective spreading of heat generated on the entire backside of the semiconductor die components from localized heat spots followed by heat sinking which can be selected to be optimized for a particular application. Alternatively, embodiments of the present invention enable semiconductor die components and semiconductor die modules to be operated at a higher power without exceeding a desired operating temperature.

BACKGROUND OF INVENTION

A well-known problem in electronic devices is that of heat dissipation. High temperatures often limit the performance and/or lifetime of such devices. This is a particular problem in semiconductor devices which operate at high power and/or high frequency such as microwave amplifiers, power switches and optoelectronic devices. It is therefore desirable to be able to spread any heat generated by component devices to reduce temperatures and thus improve device performance, increase lifetime, and/or increase power density. Accordingly, it is desirable to utilize a heat spreading substrate material with a high thermal conductivity to spread the heat generated by electronic device components, lowering the power density and facilitating dissipation via a heat sink thus improving device performance, increasing lifetime, and/or enabling an increase in power density.

Diamond has unique properties as a heat spreading material, combining the highest room temperature thermal conductivity of any material, with high electrical resistivity and low dielectric loss when in an intrinsic un-doped form. Thus diamond can be utilized as a heat spreading substrate for semiconductor components in a number of high power density applications. Furthermore, through the doping of the polycrystalline diamond, the heat spreader may also be conductive, thus enabling the heat spreader to become an electrical connection, if so desired. The advent of large area polycrystalline diamond produced by a chemical vapour deposition (CVD) technique has expanded the applications for diamond heat spreaders via an increase in area and a reduction in cost. Furthermore, the steadily increasing size of available single crystal synthetic diamond plates is also enabling use of such materials in heat spreading applications which require extremely high thermal performance.

Electronic device packages comprising integrated diamond heat spreaders are known in the art. For example, US2012/003794 discloses an electronic device package configuration in which a diamond thermal heat spreader is disposed between a carrier pad and an overlying semiconductor die. The composite carrier pad/diamond heat spreader/semiconductor die structure is then mounting within an opening of a lead frame. Wire bonds are formed between the semiconductor die and the lead frame and the whole structure is encapsulated in a mould material.

US2010/0149756 discloses an alternative arrangement for integrating a diamond heat spreader into an electronic device package. This document proposes that a diamond heat spreader is mounted to a metal frame and that this composite diamond heat spreader/metal frame structure is bonded over a ceramic carrier substrate on which a semiconductor die is mounted such that a surface of the diamond heat spreader is in contact with, but not adhered to, a surface of the semiconductor die. A heat sink is them mounted over the composite diamond heat spreader/metal frame structure such that a surface of the heat sink is in contact with, but not adhered to, a surface of the diamond heat spreader.

While the aforementioned configurations provide potentially viable solutions to the problem of integrating a diamond heat spreader into an electronic device package it is an aim of certain embodiments of the present invention to provide new configurations which can be made more compact in size, provide good heat spreading and/or heat sinking capability, and which are more suited for mounting into a range of different electronic device and/or heat sink configurations thereby providing a commercial product which can be used in a wider range of electronic device types, configurations, and applications.

For example, the present inventors have noted that the configuration described in US2012/003794 requires, as an essential feature, the presence of a carrier pad. In the described embodiments the carrier pad is mounted within an opening of a lead frame with a diamond heat spreader and a semiconductor die mounted on top of the carrier pad. The carrier pad thus acts as a supporting substrate for the heat spreader and semiconductor die. As the carrier pad is an integral part of the described electronic device package, it is not possible to readily change the material or construction of the carrier pad according to a particular electronic device application or configuration. Furthermore, the presence of the carrier pad increases the depth of the electronic device package and thus may not be usable in certain electronic device configurations which require very thin electronic device packages.

Similar problems may also apply to the configurations described in US2010/0149756. In the configurations described therein, the semiconductor dies are not directly mounted to the diamond heat spreader but rather are mounted to a separate ceramic substrate comprising metal connections disposed therein. A stacked structure is formed comprising ceramic support substrate/semiconductor die/heat spreader-metal holder complex/heat sink. This stacked structure based on a ceramic supporting substrate increases the depth of the electronic device package and thus may not be usable in certain electronic device configurations which require very thin electronic device packages. Furthermore, a heat sink having a shape complimentary to an upper recess in a diamond heat sink/metal frame composite structure appears to be required to mount the heat sink in contact with the diamond heat spreader. As such, the mounting configuration for the diamond heat spreader does not appear to be readily applicable to a generic heat sink having a substantially planer mounting surface.

Figure 1:
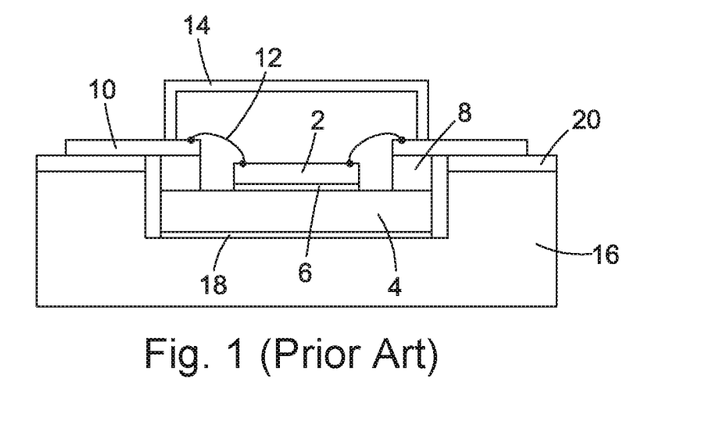
FIG. 1 illustrates a cross-sectional view of an electronic device configuration comprising a metallic heat spreader (not according to the present invention)
Figure 2:
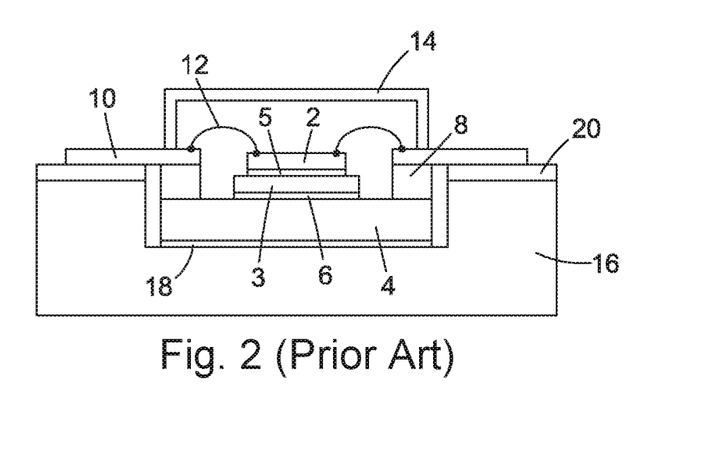
FIG. 2 illustrates a cross-sectional view of an electronic device configuration comprising a metallic heat spreader with a diamond heat spreader mounted on a top surface thereof (not according to the present invention)
Figure 3:
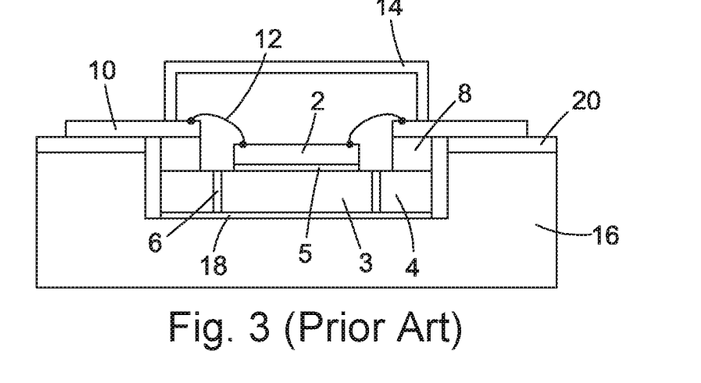
FIG. 3 illustrates a cross-sectional view of an electronic device configuration comprising a metallic heat spreader with a diamond heat spreader mounted within a window formed in the metallic heat spreader (not according to the present invention)

FIGS. 1 to 3 illustrate several possible electronic device package configurations which aid in setting the context for the present invention. Like reference numerals have been used for like parts to aid comparison of the configurations illustrated in FIGS. 1 to 3.

FIG. 1 shows a schematic diagram illustrating a standard RF device configuration. The configuration comprises a semiconductor component 2 mounted on a metallic heat spreader 4 via a bonding material 6. An electrically insulating ceramic frame 8 is provided on the metallic heat spreader 4. Electrical connections 10 are mounted on the electrically insulating ceramic frame 8 and configured to electrically connect to the one or more semiconductor components via wire connections 12. The package is encapsulated with an encapsulating cap 14 and mounted on a metallic heat sink 16 via a bonding material 18. An insulating layer 20 is provided on the heat sink 16 to electrically insulate the electrical connections 10 from the heat sink.

FIG. 2 shows a schematic diagram illustrating an RF device configuration similar to that illustrated in FIG. 1 but incorporating a diamond heat spreader.

The configuration comprises a semiconductor component 2 mounted on a diamond heat spreader 3 via a bonding material 5. The diamond heat spreader 3 is mounted on a metallic heat spreader 4 via a bonding material 6. An electrically insulating ceramic frame 8 is provided on the metallic heat spreader 4. Electrical connections 10 are mounted on the electrically insulating ceramic frame 8 and configured to electrically connect to the one or more semiconductor components via wire connections 12. The package is encapsulated with an encapsulating cap 14 and mounted on a metallic heat sink 16 via a bonding material 18. An insulating layer 20 is provided on the heat sink 16 to electrically insulate the electrical connections 10 from the heat sink.

The configuration illustrated in FIG. 2 is therefore similar to that shown in FIG. 1 with the exception that a diamond heat spreader 3 is inserted between the semiconductor component 2 and the metallic heat spreader 4. The diamond heat spreader 3 aids in improving heat spreader immediately under the semiconductor component 2. However, in providing the diamond heat spreader 3 on top of the metallic heat spreader 4, the distance between the semiconductor component 2 and the heat sink 16 is increased. Furthermore, the number of interfaces between the semiconductor component 2 and the heat sink 16 is increased. Both these factors increase the resistance to heat flow from the semiconductor component 2 into the heat sink 16 and will counteract, to some extent, the beneficial effects of the diamond heat spreader 3.

FIG. 3 shows a schematic diagram illustrating an RF device configuration similar to that illustrated in FIG. 2 but incorporating the diamond heat spreader 3 into a window within the metallic heat spreader 4.

The configuration comprises a semiconductor component 2 mounted on a diamond heat spreader 3 via a bonding material 5. The diamond heat spreader 3 is mounted into a window within a metallic heat spreader 4 via a bonding material 6. An electrically insulating ceramic frame 8 is provided on the metallic heat spreader 4. Electrical connections 10 are mounted on the electrically insulating ceramic frame 8 and configured to electrically connect to the one or more semiconductor components via wire connections 12. The package is encapsulated with an encapsulating cap 14 and mounted on a metallic heat sink 16 via a bonding material 18. An insulating layer 20 is provided on the heat sink 16 to electrically insulate the electrical connections 10 from the heat sink.

The configuration illustrated in FIG. 3 is therefore similar to that shown in FIG. 2 with the exception that the diamond heat spreader 3 is mounted within a window in the metallic heat spreader 4 rather than on a top surface of the metallic heat spreader 4. The diamond heat spreader 3 aids in improving heat spreader immediately under the semiconductor component 2. Furthermore, by providing the diamond heat spreader 3 in a window within the metallic heat spreader 4, the distance between the semiconductor component 2 and the heat sink 16 is reduced relative to the arrangement shown in FIG. 2. Furthermore, the number of interfaces between the semiconductor component 2 and the heat sink 16 is reduced relative to the arrangement shown in FIG. 2. Both these factors reduce the resistance to heat flow from the semiconductor component 2 into the heat sink 16 and aid in increasing the beneficial effects of the diamond heat spreader 3.

An electronic device package configuration similar to that illustrated in FIG. 3 is described and illustrated in EP0932199. This document describes a package configuration in an electronic device is mounted on a diamond heat spreader which is itself mounted within a window of a copper clad molybdenum heat spreader or flange. An alumina frame is is provided on the copper clad molybdenum flange. Electrical connections in the form of copper leads are mounted on the alumina frame and configured to electrically connect to the electronic device via wire connections. The package is encapsulated with an encapsulating cap and mounted on a metallic heat sink 16 via a bonding material 18.

It is an aim of certain embodiments of the present invention to provide an improved electronic device package when compared to the aforementioned configurations.

SUMMARY OF INVENTION

According to a first aspect of the present invention there is provided an electronic device component comprising:
a support frame comprising a top surface, a bottom surface, and an opening extending between the top surface and bottom surface of the support frame;
a diamond heat spreader comprising a wafer of synthetic diamond material having a top face, a bottom face, wherein the diamond heat spreader is bonded to the support frame so that the diamond heat spreader extends across the opening in the support frame; and
one or more semiconductor components mounted on, and bonded to, the top face of the diamond heat spreader,
wherein the support frame is formed of an electrically insulating ceramic material to which the diamond heat spreader is bonded, and
wherein one or more electrical connections are mounted on the electrically insulating ceramic support frame and configured to electrically connect to the one or more semiconductor components.

The electronic device component as defined above is similar in some respects to that illustrated in FIG. 3 and described in EP0932199. However, the present inventors have realized that the metallic heat spreader or flange can be dispensed with completely when using a diamond heat spreader such that the diamond heat spreader is directly bonded to an electrically insulating ceramic support plate. This modification has several advantages when compared to the configuration illustrated in FIG. 3 and described in EP0932199:

(i) By dispensing with the metallic heat spreading frame the configuration is more compact and simple in construction. There is no longer a requirement to have a separate component electrically insulating the support frame from the electrical connections.
(ii) Better thermal interface between the diamond heat spreader and the support frame. In diamond and electrically insulating ceramics, heat is conducted via phonons while metallic materials primarily conduct heat via electron flow. By providing the diamond heat spreader in direct thermal contact with an electrically insulating ceramic support frame, heat flow in both the diamond heat spreader and the ceramic support frame is via phonons which can aid in heat transfer at the barrier between the diamond heat spreader and the electrically insulating ceramic support frame. In contrast, when a diamond heat spreader is bonded to a metallic support frame, the transition between a phonon heat flow mechanism in the diamond material and an electron heat flow mechanism in the metallic material can lead to a resistive barrier to heat transfer.
(iii) Electrical tracks can be formed directly on the electrically insulating ceramic support frame and the diamond heat spreader bonded within the electrically insulating ceramic support frame given more flexibility for providing electrical connections to components mounted on the diamond heat spreader without the requirement for individual wire connections.
(iv) Other electrical components which do not require extreme thermal management can be mounted on the ceramic support frame and this, combined with metallized tracks as described in point (iii) gives more flexibility for providing complex circuits over the diamond/ceramic heat spreader component.

In one configuration the one or more electrical connections are formed of a metallization layer which is disposed on the top surface of the support frame and on the top face of the diamond heat spreader and which is patterned to form one or more conduction tracks on the top surface of the support frame and diamond heat spreader. One or more semiconductor components are mounted on, and bonded to, the top surface of the support frame. Furthermore, the top face of the diamond heat spreader is co-planar with the top surface of the lead frame (e.g. to within 500 µm, 400 µm, 300 µm, 200 µm, 100 µm, 50 µm, 30 µm, or 20 µm). This configuration provides a planar metallized surface across both the ceramic support and the diamond heat spreader such that one or more semiconductor components can be readily mounted and electrically connected on both the diamond heat spreader and the ceramic support frame via a single metallization layer.

According to a second aspect of the present invention there is provided a heat spreading substrate for use in the electronic device component as previously defined, the heat spreading substrate comprising:
a support frame comprising a top surface, a bottom surface, and an opening extending between the top surface and bottom surface of the support frame; and
a diamond heat spreader comprising a wafer of synthetic diamond material having a top face and a bottom face, wherein the diamond heat spreader is bonded to the support frame so that the diamond heat spreader extends across the opening in the support frame,
wherein the support frame is formed of an electrically insulating ceramic material.

Such a heat spreading substrate may further comprise a metallization layer disposed on the top surface and/or the bottom surface of the ceramic support frame and/or the top face and/or the bottom face of the diamond heat spreader.

Such a package configuration can be sold to electronic device manufacturers who can pattern the metallization layer(s) according to desired circuit designs, mount semiconductor components onto the diamond heat spreader and optionally the ceramic support frame, and then encapsulate the electronic device component. Again, one configuration for the heat spreading substrate is to provide a co-planar arrangement for the face of the diamond heat spreader and the top surface of the support frame and provide a metallization layer which is disposed on the top surface of the support frame and on the top face of the diamond heat spreader.

A method of fabricating a heat spreading substrate is also provided, the method comprising:
mounting a diamond heat spreader in a green ceramic body;
firing the green ceramic body whereby the ceramic body shrinks and hardens around the diamond heat spreader thus directly bonding the diamond heat spreader to the ceramic body which forms a ceramic support frame around the diamond heat spreader; and
metallizing a top surface of the diamond heat spreader and the ceramic support frame.

This method allows direct bonding of the diamond heat spreader and ceramic support frame with a metallization layer which cross the bond. By avoiding the use of bonding agents such as solders and metal brazes, the possibility of electrical shorting via the bonding agent is avoided.

The electronic device component can be mounted to a heat sink with a bottom face of the diamond heat spreader forming an interface with the heat sink.

Electronic device components as described herein enable semiconductor components to be mounted directly on a top face of a diamond heat spreader while also leaving the bottom face of the diamond heat spreader exposed so that the bottom face of the diamond heat spreader can for a direct thermal interface with the heat sink. The heat sink can be metallic and since the support frame is an insulating ceramic then there is no problem with electrical shorting between the heat sink and electrical circuitry provided on the top surface of the ceramic support frame in which the diamond heat spreader is mounted.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

FIGS. 1 to 3 illustrates several possible electronic device configurations which aid in setting the context for the present invention and which have been discussed in the background section of this specification.

Figure 4:
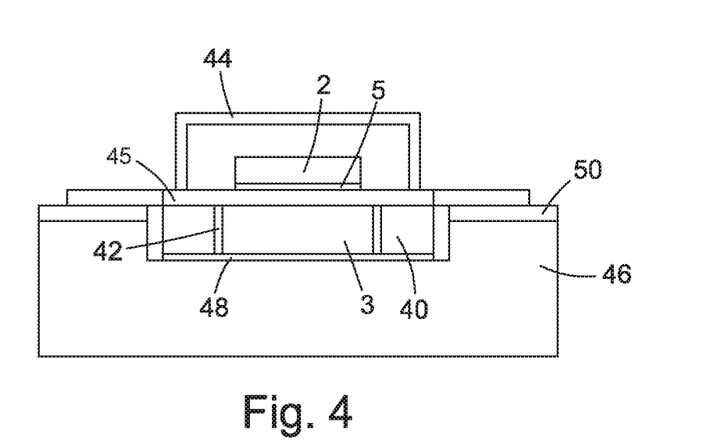
FIG. 4 illustrates a cross-sectional view of an electronic device configuration comprising a ceramic support frame with a diamond heat spreader mounted within a window formed in the ceramic support frame.

An example of an electronic device configuration according to the present invention is illustrated in FIG. 4. The configuration as illustrated in FIG. 4 comprises a semiconductor component 2 mounted on a diamond heat spreader 3 via a bonding material 5. The diamond heat spreader 3 is mounted into a window within an electrically insulating ceramic support frame 40 via a bonding material 42. Electrical connections 45 are mounted on the electrically insulating ceramic frame 42 and configured to electrically connect to one or more semiconductor components. The package is encapsulated with an encapsulating cap 44 and mounted on a metallic heat sink 46 via a bonding material 48. An insulating layer 50 is provided on the heat sink 46 to electrically insulate the electrical connections 45 from the heat sink 46. The insulating layer 50 will usually have circuitry mounted thereon, i.e. it may be a printed circuit board.

The configuration illustrated in FIG. 4 is similar to the configuration illustrated in FIG. 3 but with the metallic heat spreader 4 and the electrically insulating ceramic frame 8 of FIG. 3 replaced by a single electrically insulating ceramic support frame to which the diamond heat spreader is bonded. Because the support frame in which the diamond heat spreader is bonded is electrically insulating in the configuration of FIG. 4, then one or more electrical connections can be mounted directly on the electrically insulating ceramic support frame and configured to electrically connect to the one or more semiconductor components.

As described in the summary of invention section, the present inventors have realized that the metallic heat spreader or flange provided in prior art arrangements can be dispensed with completely when using a diamond heat spreader such that the diamond heat spreader is directly bonded to an electrically insulating ceramic support plate. This modification has several advantages when compared to the configuration illustrated in FIG. 3 and described in EP0932199:

(i) By dispensing with the metallic heat spreading frame the configuration is more compact and simple in construction. There is no longer a requirement to have a separate component electrically insulating the support frame from the electrical connections.

(ii) Better thermal interface between the diamond heat spreader and the support frame. In diamond and electrically insulating ceramics, heat is conducted via phonons while metallic materials primarily conduct heat via electron flow. By providing the diamond heat spreader in direct thermal contact with an electrically insulating ceramic support frame, heat flow in both the diamond heat spreader and the ceramic support frame is via phonons which can aid in heat transfer at the barrier between the diamond heat spreader and the electrically insulating ceramic support frame. In contrast, when a diamond heat spreader is bonded to a metallic support frame, the transition between a phonon heat flow mechanism in the diamond material and an electron heat flow mechanism in the metallic material can lead to a resistive barrier to heat transfer.

(iii) Electrical tracks can be formed directly on the electrically insulating ceramic support frame and the diamond heat spreader bonded within the electrically insulating ceramic support frame given more flexibility for providing electrical connections to components mounted on the diamond heat spreader without the requirement for individual wire connections.

(iv) Other electrical components which do not require extreme thermal management can be mounted on the ceramic support frame and this, combined with metallized tracks as described in point (iii) gives more flexibility for providing complex circuits over the diamond/ceramic heat spreader component.

The ceramic support frame should be fabricated from an electrically insulating ceramic material selected to provide sufficient mechanical stability for supporting the diamond heat spreader with electronic components mounted thereon. The ceramic support frame may have a thickness of at least 50 μm, 100 μm, 150 μm, 200 μm, 250 μm, 300 μm, 400 μm, 500 μm, or 600 μm. It may also be preferable to select a ceramic material which has a thermal expansion coefficient which is reasonably well matched to that of the diamond heat spreader across a range of operating temperatures to ensure that expansion coefficient mismatches do not lead to delamination of the diamond heat spreader from the ceramic support frame in use.

In addition, it may also be preferable to select a ceramic material which has a reasonably high thermal conductivity to further spread the heat generated by semiconductor components on the diamond heat spreader and optionally other semiconductor components mounted on the ceramic support frame. Examples of suitable materials for the electrically insulating ceramic support frame include one or more of: aluminium oxide; aluminium nitride, silicon nitride; or silicon carbide.

While the ceramic support frame 40 illustrated in FIG. 4 is substantially planar, it is also possible to provide a recessed ceramic support frame in which a central region of the top surface of the ceramic support frame is recessed relative to a peripheral region. In this respect a single unitary ceramic component can be provided which has a geometry similar to the composite metallic flange 4 and electrically insulating ceramic frame 8 configuration illustrated in FIG. 3. Such a geometry in which a raised peripheral region is provided can be useful for providing suitable wire bonding configurations for certain applications.

Figure 5:
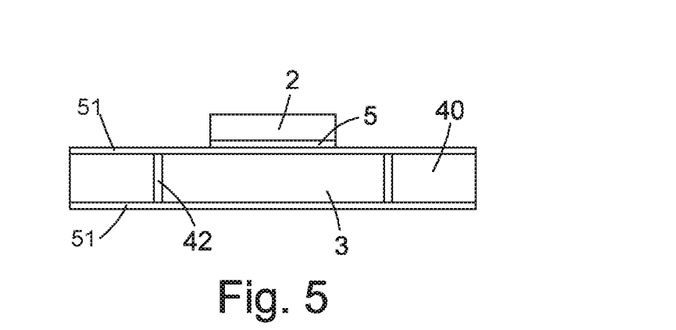
FIG. 5 shows a cross-sectional view of the electronic device component of FIG. 4 prior to mounting on a heat sink and with the encapsulating cap removed for clarity.

FIG. 5 shows a cross-sectional view of the electronic device component of FIG. 4 prior to mounting on a heat sink and with the encapsulating cap removed for clarity. The electronic device component can be constructed by bonding the diamond heat spreader 3 into a window within the ceramic frame 40 using a bonding material 42. The diamond/ceramic heat spreading component can be planarized and optionally metallized 51. As described in the summary of invention section, such heat spreading substrate can be sold to electronic device manufacturers who can pattern the metallization layer(s) 51 according to desired circuit designs, mount one or more semiconductor components 2 onto the diamond heat spreader 3 using a suitable bonding material 5 and then encapsulate the package for subsequent mounting onto a heat sink.

Figure 6:
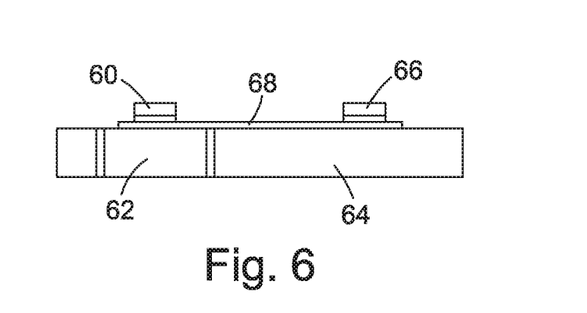
FIGS. 6 and 7 show cross-sectional and plan views of another electronic device component which comprises a semiconductor component mounted on a diamond heat spreader within a ceramic support frame and a further semiconductor component which does not require extreme thermal management mounted on the ceramic support frame, with metallization forming tracks to connect the semiconductor components.
Figure 7:
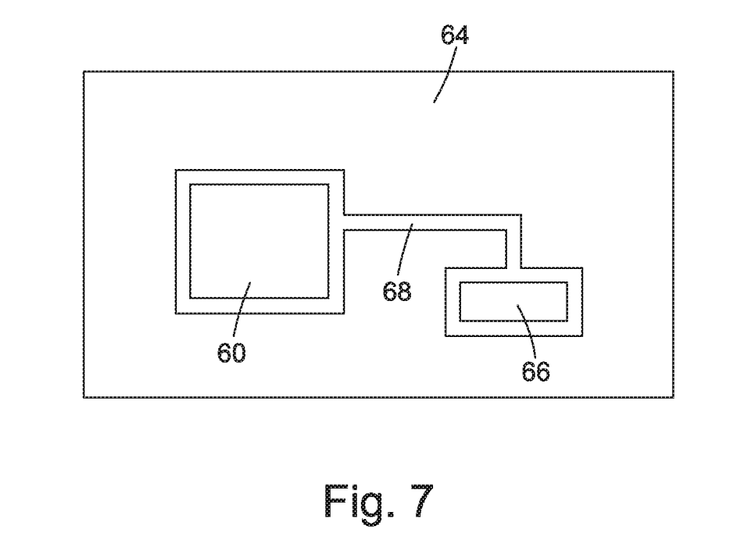

FIG. 6 and FIG. 7 show cross-sectional and plan views of another electronic device component which comprises a semiconductor component 60 mounted on a diamond heat spreader 62 within a ceramic support frame 64, a further semiconductor component 66 which does not require extreme thermal management mounted on the ceramic support frame 64, and metallization 68 forming tracks to connect the semiconductor components 60, 66.

As an alternative to the arrangement shown in FIGS. 6 and 7 in which a single diamond heat spreader is mounted in a ceramic support frame with semiconductor components either mounted on the single diamond heat spreader or on the ceramic support frame, more than one diamond heat spreader may be mounted within the ceramic support frame. That is, the electronic device component may comprise an insulating ceramic support frame having at least two openings with a diamond heat spreader extending across each opening. One or more semiconductor components can then be mounted on each of the diamond heat spreaders. Further semiconductor components which do not require such extreme thermal management can be mounted on the ceramic support frame. Optionally, electrical tracks can be provided on the substrate linking semiconductor components mounted on the diamond heat spreaders and/or the ceramic support frame. In certain configurations, the geometry (e.g. thickness) and/or diamond material grade (e.g. thermal conductivity) may be varied between different diamond heat spreaders mounted in a ceramic support frame to provide different heat spreading capability as required for different semiconductor components which are to be mounted thereon. That is, a number of different diamond heat spreaders can be provided which are optimized for semiconductor devices having different power ratings and/or operating temperatures.

Figure 8:
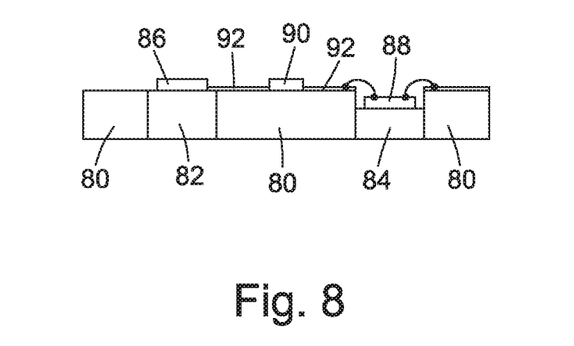
FIG. 8 shows a cross-sectional view of another electronic device component comprising a ceramic support frame in which multiple diamond heat spreaders are mounted.

FIG. 8 shows a schematic cross-sectional view of one such configuration. A ceramic support frame 80 is provided comprising two openings in which diamond heat spreaders 82, 84 are mounted. Semiconductor components 86, 88 are mounted on the diamond heat spreaders 82, 84. In the illustrated arrangement the diamond heat spreader 82 is thicker than the diamond heat spreader 84. In the illustrated arrangement a further semiconductor component 90 is mounted on the top face of the ceramic support frame 80. Conductive tracks 92 are provided over the ceramic support frame 80 to connect the semiconductor components 86, 88, 90.

The diamond heat spreader should be provided with a strength and thickness such that it is capable of supporting one or more semiconductor dies without requiring an additional supporting substrate or carrier pad, therefore allowing a reduction in height of the overall electronic device package. Furthermore, the diamond heat spreader has a thermal conductivity which is sufficiently high for a given operating power density of the or each semiconductor die that heat is efficiently removed from the semiconductor dies reducing the temperature of hot spots and minimizing stress caused by thermal expansion coefficient mismatch between the diamond heat spreader and the overlying semiconductor dies. This feature, in combination with the selection of suitable thermally conductive bonding material for directly bonding the plurality of semiconductor dies to a top face of the diamond heat spreader enables reliable bonding of the semiconductor die components which does not fail in use due to thermally generated stress. Electrical connections are configured to electrically connect the semiconductor dies across the ceramic support frame and out of the device package. The semiconductor die components and the electrical connections are preferably encased in an encapsulant to form a robust and stable product. Standard encapsulant materials may be utilized or alternatively a low temperature CVD diamond encapsulant may be provided. However, it is also envisaged that the electronic device component could be manufactured and sold in an unencapsulated state.

The diamond heat spreader may be mounted within the opening of the ceramic support frame such that at least a majority volume of the diamond heat spreader is located within the opening of the ceramic support frame. One useful feature of the configuration illustrated in FIG. 4 is that the bottom face of the diamond heat spreader is positioned to be substantially co-planar with the bottom surface of the ceramic support frame. This provides the electronic device package with a substantially planar lower surface with the diamond heat spreader exposed. Such a configuration enables the electronic device component to be readily mounted to a heat sink in use. For example, the ceramic support frame may be provided with one or more screw holes such that the electronic device component can mechanical mounted onto a heat sink by merely screwing the electronic device component onto a top surface of the heat sink to provide thermal contact with the diamond heat spreader.

The present inventors have realized that synthetic diamond heat spreaders, such as those formed from high quality polycrystalline CVD synthetic diamond wafers or single crystal synthetic diamond plates, have characteristics which, in combination with selected bonding techniques, enable a new design of electronic device component incorporating such wafers. The new design of electronic device component structure is more compact than previous designs and is readily incorporated into a wide range of electronic device package geometry types, configurations, and applications utilizing a range of heat sink materials and configurations. For example, a selection of package geometries as outlined in JEDEC (Joint Electron Device Engineering Council) standards.

The high quality polycrystalline CVD synthetic diamond wafers or single crystal synthetic diamond plates may have a thickness of at least 50 μm and optionally a tensile rupture strength with a nucleation face of the polycrystalline CVD diamond wafer in tension of at least 300 MPa, a tensile rupture strength with a growth face of the polycrystalline CVD diamond wafer in tension of at least 200 MPa, and a thermal conductivity of at least 600 $Wm^{-1}K^{-1}$. Such wafers are sufficiently robust that it is possible to not only mount a plurality of semiconductor dies on such wafers but also mount the wafers within a ceramic lead frame such that the diamond material functions as the supporting substrate for the semiconductor dies, in addition to providing heat spreading functionality, without requiring a carrier pad to be integrated within the structure to support the diamond heat spreader and semiconductor dies as described in US2012/0003794.

In order to provide a robust mounting configuration the diamond heat spreader may be mounted within the opening of the ceramic support frame by a bonding material such that at least a majority volume of the diamond heat spreader is located within the opening of the ceramic support frame. Furthermore, in order to ensure that the electronic device component can be mounted to a range of generic, and usually planar, heat sinks within an electronic device the diamond heat spreader is mounted within the opening of the ceramic support frame such that a bottom face of the diamond heat spreader is co-planar with a bottom surface of the ceramic lead frame or is located outwards from the bottom surface of the ceramic lead frame.

In addition, it has been found that thermally conductive bonding materials can be selected such that a plurality of semiconductor dies can mounted on, and bonded to, a top face of the diamond heat spreader in order to provide good thermal contact between the semiconductor dies and the diamond heat spreader while being sufficiently flexible to compensate for thermal expansion mismatches between the semiconductor dies and the diamond heat spreader. As such, more complicated mounting arrangements in which the semiconductor dies are mounted to a separate support substrate as described in US2010/0149756 can be avoided.

The ceramic support frame may comprise one or more mechanical connectors for mounting the electronic device component to a heat sink with the bottom face of the diamond heat spreader forming an interface with the heat sink. In the previously described embodiment the bottom face of the diamond heat spreader is positioned to be substantially co-planar with the bottom surface of the ceramic lead frame. However, in an alternative arrangement it is envisaged that the bottom face of the diamond heat spreader may be located outwards from the bottom surface of the ceramic support frame. For example, the bottom face of the diamond heat spreader may define a plane which is located to be no more than 500 µm, 400 µm, 300 µm, 200 µm, 100 µm, 50 µm, 30 µm, or 20 µm from a plane defined by the bottom surface of the ceramic support frame. Similarly, the bottom face of the diamond heat spreader may define a plane which is located to be no less than 5 µm, 20 µm, 35 µm, 50 µm, 75 µm, 100 µm, 150 µm, 200 µm, or 300 µm from a plane defined by the bottom surface of the ceramic support frame.

Alternatively or additionally, the mechanical connectors may comprise one or more spacer elements on a bottom surface of the ceramic support frame for spacing the bottom surface of the ceramic support frame from a heat sink when mounted thereto with the bottom face of the diamond heat spreader forming an interface with the heat sink.

As previously described, the thickness, tensile strength, and thermal conductivity of the diamond heat spreader should be selected to ensure both robust mounting and support and also efficient heat spreading functionality to reduce hot spots during use and enable a direct semiconductor die-on-diamond heat spreader bonding configuration which is thermally stable and robust. As such, the diamond material forming the diamond heat spreader may comprise one or more of the following characteristics:

- a thickness at least 50 µm, 100 µm, 150 µm, 200 µm, 250 µm, 300 µm, 400 µm, 500 µm, or 600 µm;
- a thermal conductivity of at least 600 Wm$^{-1}$K$^{-1}$, 800 Wm$^{-1}$K$^{-1}$, 1000 Wm$^{-1}$K$^{-1}$, 1200 Wm$^{-1}$K$^{-1}$, or 1400 Wm$^{-1}$K$^{-1}$ (for example, as measured through plane by laser flash);
- a tensile rupture strength with a nucleation face of the polycrystalline CVD diamond wafer in tension of: ≥760 MPa×n for a thickness of 100 to 500 µm; ≥700 MPa×n for a thickness of 500 to 750 µm; ≥650 MPa×n for a thickness of 750 to 1000 µm; ≥600 MPa×n for a thickness of 1000 to 1250 µm; ≥550 MPa×n for a thickness of 1250 to 1500 µm; ≥500 MPa×n for a thickness of 1500 to 1750 µm; ≥450 MPa×n for a thickness of 1750 to 2000 µm; or ≥400 MPa×n for a thickness of ≥2000 µm, wherein multiplying factor n is 1.0, 1.1, 1.2, 1.4, 1.6, 1.8, or 2;
- a tensile rupture strength with a growth face of the polycrystalline CVD diamond wafer in tension of: ≥330 MPa×n for a thickness of 100 to 500 µm; ≥300 MPa×n for a thickness of 500 to 750 µm; ≥275 MPa×n for a thickness of 750 to 1000 µm; ≥250 MPa×n for a thickness of 1000 to 1250 µm; ≥225 MPa×n for a thickness of 1250 to 1500 µm; ≥200 MPa×n for a thickness of 1500 to 1750 µm; ≥175 MPa×n for a thickness of 1750 to 2000 µm; or ≥150 MPa×n for a thickness of ≥2000 µm, wherein multiplying factor n is 1.0 1.1, 1.2, 1.4, 1.6, 1.8, or 2;
  - a single crystal diamond plate with a fracture stress no less than 750 MPa; and
  - a surface flatness ≤20 µm, ≤10 µm, or ≤5 µm.

It is advantageous to use diamond material for the diamond heat spreader which has a high thermal conductivity. This can be measured directly in some instances, although it can be difficult to do so on small samples or thin layers. That said, systematic measurements show a relationship between thermal conductivity and optical absorption. Specifically, the thermal conductivity (for example, as measured by laser flash) has been shown to correlate with absorption features associated with $CH_x$ defects (Twitchen, Pickles, Coe, Sussmann, Hall, Diamond & Related Materials 10 (2001) 731-735). Hence the integrate absorption (in cm$^{-1}$) between the frequencies 2760 cm$^{-1}$ and 3030 cm$^{-1}$ can be measured and a thermal conductivity inferred. Thus, the diamond material may exhibit an optical absorption no more than 3.0 cm$^{-1}$, 2.5 cm$^{-1}$, 2.0 cm$^{-1}$, 1.5 cm$^{-1}$, 1.2 cm$^{-1}$, 1.0 cm$^{-1}$, 0.8 cm$^{-1}$, or 0.6 cm$^{-1}$.

For certain applications where the diamond heat spreader also functions to electrically isolate device components another key property of the diamond is its electrical insulating properties. For example, the diamond material of the heat spreader may have an electrical resistivity no less than $1 \times 10^{10}$ Ωcm, $3 \times 10^{10}$ Ωcm, $1 \times 10^{11}$ Ωcm, $3 \times 10^{11}$ Ωcm, or $1 \times 10^{12}$ Ωcm.

It should also be noted that a thicker diamond heat spreader will increase lateral heat spreading from hot spots under the semiconductor dies in use which can both improve the thermal management of the semiconductor dies whilst also ensuring that bonding between the semiconductor dies and the diamond heat spreader is less prone to failure due to thermally induced mechanical stress. However, for certain applications a relatively thin wafer of synthetic diamond material can be utilized such that thermal conduction is largely vertical in direction such that heat is transported directly into an underlying heat sink. Such an arrangement may be used for applications where temperatures generated in the semiconductor dies are not so extreme or where the electronic device package is mounted to an extremely efficient heat sink.

In thin diamond layers the thermal conductivity is affected by the nucleation layer which has extremely small grain size and thus poor thermal conductivity and it is better to remove this using lapping and polishing techniques known in the art. Even after processing, it is better to locate the side of a polycrystalline CVD diamond wafer which was closest to the growth surface against the semiconductor die(s), and the side that was closest to the nucleation side towards the exterior of the electronic device package and ultimately the heat sink. Preferably the grain size of the top face of the diamond heat spreader on which the semiconductor dies are bonded should exceed 2 µm, 3 µm, 5 µm, 7 µm, 10 µm, 13 µm, 15 µm. Preferably the grain size of the bottom face of the diamond heat spreader which is to form an interface with a heat sink should exceed 0.5 µm, 1 µm, 2 µm, 3 µm, 5 µm, 7 µm, 10 µm. Preferably the grain size of the top face of the diamond heat spreader should exceed the grain size of the bottom face of the heat spreader. Preferably at least 5 µm, 10 µm, 15 µm, 20 µm, 25 µm, 30 µm of the nucleation layer should be removed from the diamond heat spreader before mounting.

The lateral dimensions of the bottom face of the diamond heat spreader exposed towards the heat sink should exceed those of the hot region of the semiconductor die(s) by at least the thickness of diamond heat spreader and preferably by at least 100 µm, 300 µm, 500 µm, 750 µm, 1 mm, 1.3 mm, 1.7 mm, 2 mm. Larger lateral dimensions will aid in heat spreading and transfer of heat to a heat sink on which the electronic device component is mounted in use for efficient heat sinking.

While the aforementioned materials characteristics have largely been described in relation to high quality polycrystalline CVD synthetic diamond wafers, the present inventors have also noted that similar or better characteristics can be provided by utilizing single crystal synthetic diamond plates, although in certain applications use of such material may be limited by cost and size.

The bonding material which mounts the diamond heat spreader within the opening of the ceramic support frame can be provided by any material which is sufficiently elastic to maintain bonding between these components while absorbing relative displacements of the components in use due to mismatches in thermal expansion coefficient. Examples include: a polymer adhesive; a ceramic cement; an epoxy; a metallic solder; and a metallic braze. In certain embodiments, the bonding between the diamond heat spreader and the ceramic support frame can be provided by the encapsulant material overlying the device structure. Alternatively still, the ceramic support frame may be directly bonded to the diamond heat spreader by, for example, firing the ceramic with the diamond heat spreader mounted therein.

If a metallic braze is used to bond the diamond heat spreader to the ceramic support frame then the braze itself will be electrically conductive. If the top surface is then metallized across the braze join then an electrically conductive path will be present between the top and bottom surfaces of the diamond heat spreader via the braze join. The top and bottom surfaces of the diamond heat spreader can be completely metallized (including across the braze join) if electrical isolation is not required between the top and bottom surfaces of the diamond heat spreader. However, if electrical isolation is required between the top and bottom surfaces of the diamond heat spreader then the metallization and braze join must be configured such that an electrically conductive path is not present between the top and bottom surfaces of the diamond heat spreader via the braze join. For example, a gap may be provided in the surface metallization of the diamond heat spreader/ceramic support frame assembly at the braze join to avoid an electrically conductive path between the top and bottom surfaces of the diamond heat spreader via the braze join. Similar comments apply when using soft or hard metallic solders for the bonding between the diamond heat spreader and the ceramic support frame.

As an alternative to the metallic, electrically conductive bonding materials described above, an electrically insulating bonding material may be used to bond the diamond heat spreader to the ceramic support frame. An example of such a material is a ceramic cement. Such an electrically insulating bond allows surface metallization across the diamond heat spreader-bond-ceramic support plate assembly while ensuring that the top and bottom surfaces of the assembly are electrically isolated.

Yet another alternative for bonding the diamond heat spreader to the ceramic support frame is to directly bond the diamond heat spreader to the ceramic support frame without any additional bonding material therebetween. This can be achieved by firing the diamond heat spreader into the ceramic support plate. For example, the diamond heat spreader can be mounted into a green ceramic body prior to firing and then the assembly can be fired such that the ceramic shrinks and hardens around the diamond heat spreader thus directly bonding the diamond heat spreader to the ceramic support frame. The assembly can then be metallized and as there is no electrically conductive (or other) bonding material between the diamond heat spreader and the ceramic support frame then the assembly can be metallized across the interface between the diamond heat spreader and the ceramic support frame while retaining electrical isolation between the top and bottom surfaces of the assembly.

The bonding material utilized to mount the plurality of semiconductor dies to the diamond heat spreader is advantageously both thermally conductive and sufficiently elastic to maintain bonding between these components while absorbing relative displacements of the components in use due to mismatches in thermal expansion coefficient. The thermally conductive bonding which mounts the plurality of semiconductor dies to the diamond heat spreader may have a thermal conductivity of at least 50 $Wm^{-1}K^{-1}$, 100 $Wm^{-1}K^{-1}$, 200 $Wm^{-1}K^{-1}$, or 300 $Wm^{-1}K^{-1}$. Such thermal conductivity is advantageous to efficiently transfer heat from the semiconductor dies into the diamond heat spreader. Examples include thermally conductive polymer or epoxy adhesives, ceramic cements, and metallic bonds such as solders and brazes. Where metallic bonding methods are utilized such as metallic braze bonds, it is possible to select a metallic composition which allows for some mechanical displacement of bonded components at typically operating temperatures.

The previously described arrangements comprise a configuration in which the diamond heat spreader is mounted and bonded within an opening of a ceramic support frame. While the bottom face of the diamond heat spreader is located to be co-planer or protruding from a lower surface of the ceramic support frame, the upper surface may be located within the opening, co-planer with an upper surface of the ceramic support frame, or even protruding beyond the upper surface of the ceramic support frame. Furthermore, while the diamond heat spreader may be fabricated entirely from a polycrystalline CVD synthetic diamond wafer or a single crystal synthetic diamond plate, it is also envisaged that the diamond heat spreader may comprise a composite structure in which a polycrystalline CVD synthetic diamond wafer or a single crystal synthetic diamond plate is mounted within a secondary heat spreading material to form the heat spreader. For example, in one configuration the diamond heat spreader may comprise one or more single crystal synthetic diamond plates mounted within a polycrystalline CVD synthetic diamond wafer. In such arrangements top and bottom faces of the diamond material are exposed when mounted to a lead frame such that semiconductors dies can be mounted on the top face and the bottom face can be mounted to an external heat sink in use.

In certain mounting configurations it is advantageous to provide a ceramic support frame having an opening which has a wedge-shaped or step-shaped side wall to which the diamond heat spreader is mounted. This can aid in providing a more robust mounting of the diamond heat spreader and also aid in correctly and reliably positioning the top and/or bottom face of the diamond heat spreader relative to the top and/or bottom face of the ceramic support frame.

In terms of manufacturing route, one method is to mount the diamond heat spreader in the ceramic support frame and then mount the semiconductor die(s) onto the diamond heat spreader. However, as there are fewer constraints on the mounting material holding the diamond heat spreader to the ceramic support frame when compared with the mounting material used to bond the semiconductor die(s) to the diamond heat spreader, it may be preferable in certain embodiments to mount the semiconductor die(s) to the diamond heat spreader and then mount the diamond heat spreader to the ceramic support frame. Mounting of the semiconductor die(s) to the diamond heat spreader could be done whilst the diamond is still in free-standing wafer form and this may assist volume processing.

While the previous examples all comprise an arrangement in which the diamond heat spreader is mounted within an opening of the ceramic support frame, yet another envisaged alternative is a mounting arrangement in which the diamond heat spreader is mounted to a bottom surface of the ceramic support frame by bonding material around an opening in the ceramic support frame so that the diamond heat spreader extends across the opening. In other respects the components of the electronic device package can be the same as those previously described. In such a configuration a bottom face of the diamond heat spreader will be located in a plane which is spaced apart from the lower surface of the support frame. Compliance in the support frame or spacer elements may be used to ensure that such an arrangement can be mounted to a planar surface of a heat sink.

The electronic device components as previously described can be sold as a product for mounting into a range of electronic devices. The electronic device components can be sold as an encapsulated component and can by mounted to a range of heat sinks according to the configuration of the electronic device into which the electronic device component is to be incorporated. The configuration of the electronic device compomnent is such that it is compact and easy to mount with the bottom face of the diamond heat spreader forming an interface with a heat sink in order to achieve a suitably thermally managed electronic device component for a particular application. Embodiments of the present invention simplify the thermal path, giving much better thermal conductivity from internal die to external heat sink so that the contact area between the rear of the electronic device component and heat sink can be reduced without the temperature of the device rising thus allowing higher packing densities. Alternatively, the same interface area can be retained giving lower junction temperatures and longer device life.

Various forms of heat sink are envisaged and it is an important feature of the presently described component configurations that they can readily be mounted to a range of heat sinks. However, it is envisaged that in certain applications the heat sink is formed of a diamond composite material such as silicon cemented diamond (ScD) composite material. Such a solution utilizes the extreme thermal performance of diamond materials for both heat spreading and heat sinking functions and can enable a thinner wafer of polycrystalline CVD diamond material to be utilized for the heat spreader. Advantageously the sink heat has both a high thermal conductivity and a large surface area to effectively dissipate heat to the environment.

As an alternative to an ScD external heat sink, the heat sink could be provided by diamond coated ScD as, for example, described in WO2004/034466. In the latter configuration the diamond heat spreader in the electronic device component can be kept thin, and the benefit of diamond spreading heat laterally as well as through plane can then be partly provided by the diamond layer on the ScD heat sink, the grain size of which can be enhanced from that of a typical nucleation layer by the effect of growing epitaxially on the diamond crystals at the surface of the ScD. Alternatively, another form of CVD diamond based heat sink front surface could be provided, as a coating, or as a freestanding layer. The combination of diamond within the electronic device component mounted onto a further diamond layer forming part of the heat sink gives the greatest possible performance enhancement. The external diamond layer associated with the heat sink may advantageously have a low electrical conductivity in some applications, but in others can be electrically conductive (e.g. containing boron dopant) as the electrical isolation can be provided by the diamond layer in the electronic device component.

Due to the construction of the electronic device component, the heat sink can readily form a planar surface interface with the electronic device component. Furthermore, the heat sink can extend across the entire bottom face of the diamond heat spreader and under at least a portion of the bottom surface of the ceramic support frame to ensure efficient heat sinking. A thermally conductive interface material can be provided between the diamond heat spreader and the underlying heat sink to provide good thermal contact between these components. Generally this is a thermal paste having no significant strength or mounting properties as these requirements are provided by the mechanical mounting features incorporated into the support frame. However, other interface materials such as conductive epoxy materials may be provided.

The electronic device component configurations as described herein enable a reduction in the size of semiconductor die components and semiconductor die modules through the use of high quality polycrystalline CVD synthetic diamond material mounted in close thermal contact with semiconductor die components leading to more effective spreading of heat from localized heat spots followed by heat sinking which can be selected to be optimized for a particular application. Each semiconductor die component may be configured such that when mounted on the diamond heat spreader the thermal contact surface area with the diamond heat spreader is in a range 0.2 mm$^2$ to 400 mm$^2$. In certain arrangements it is envisaged that 1 to 10 semiconductor dies will be mounted on the diamond heat spreader of the electronic device component to form a semiconductor die module.

Die components may be configured to have vertically oriented electrical connectors or horizontally oriented electronic connectors. It is envisaged that semiconductor die components having horizontally oriented electrically connectors may be preferable for use in the present invention as electrical connections can be made over the diamond heat spreader. In contrast, semiconductor die components having vertically oriented electrically connectors will require the electrical connectors to be located through holes drilled in the diamond heat spreader or located around a peripheral edge of the diamond heat spreader such that electrical connections pass through a peripheral region of the opening between an edge of the diamond heat spreader and a side wall of the opening in the support frame.

While this invention has been particularly shown and described with reference to embodiments, it will be understood to those skilled in the art that various changes in form and detail may be made without departing from the scope of the invention as defined by the appending claims.

The invention claimed is:

1. An electronic device component comprising:
a support frame comprising a top surface, a bottom surface, and an opening extending between the top surface and bottom surface of the support frame;
a diamond heat spreader comprising a wafer of synthetic diamond material having a top face, a bottom face, wherein the diamond heat spreader is bonded to the support frame so that the diamond heat spreader extends across the opening in the support frame; and
one or more first semiconductor components mounted on, and bonded to, the top face of the diamond heat spreader,
wherein the support frame is formed of an electrically insulating ceramic material to which the diamond heat spreader is bonded,
wherein one or more electrical connections are mounted on the electrically insulating ceramic support frame and configured to electrically connect to the one or more first semiconductor components,
wherein the one or more electrical connections are formed of a metallization layer which is disposed on the top surface of the support frame and on the top face of the diamond heat spreader and which is patterned to form one or more conduction tracks on the top surface of the support frame and diamond heat spreader,
wherein one or more second semiconductor components are mounted on, and bonded to, the top surface of the support frame, and
wherein the top face of the diamond heat spreader is co-planar with the top surface of the support frame to within 500 µm.

2. An electronic device component according to claim 1, further comprising a metallization layer on the bottom surface of the support frame and/or the diamond heat spreader.

3. An electronic device component according to claim 1, wherein the support frame comprises at least two openings and at least two diamond heat spreaders, wherein each diamond heat spreader extends across each opening in the support frame, and wherein one or more semiconductor components are mounted on, and bonded to, the top face of each diamond heat spreader.

4. An electronic device component according to claim 3, wherein at least two of the diamond heat spreaders have different geometries and/or are composed of different grades of diamond material having different thermal conductivities.

5. An electronic device component according to claim 1, wherein the bottom face of the diamond heat spreader is co-planar with the bottom surface of the lead frame to within 500 µm, 400 µm, 300 µm, 200 µm, 100 µm, 50 µm, 30 µm, or 20 µm.

6. An electronic device component according to claim 1, wherein the top face of the diamond heat spreader is co-planar with the top surface of the lead frame to within 400 µm, 300 µm, 200 µm, 100 µm, 50 µm, 30 µm, or 20 µm.

7. An electronic device component according to claim 1, wherein the wafer of synthetic diamond material is formed of a polycrystalline CVD diamond material or a single crystal diamond material.

8. An electronic device component according to claim 1, wherein the electrically insulating ceramic support frame is formed of one or more of: aluminium oxide; aluminium nitride, silicon nitride; or silicon carbide.

9. An electronic device component according to claim 1, wherein the electrically insulating ceramic support frame has a thickness of at least 50 µm, 100 µm, 150 µm, 200 µm, 250 µm, 300 µm, 400 µm, 500 µm, or 600 µm.

10. An electronic device component according to claim 1, wherein the opening extending between the top surface and bottom surface of the support frame comprises a wedge-shaped or step-shaped side wall to which the diamond heat spreader is mounted.

11. An electronic device component according to claim 1, wherein the diamond heat spreader further comprises one or more of the following characteristics:
a thickness of at least 50 µm, 100 µm, 150 µm, 200 µm, 250 µm, 300 µm, 400 µm, 500 µm, or 600 µm;
a thermal conductivity of at least 600 $Wm^{-1}K^{-1}$, 800 $Wm^{-1}K^{-1}$, 1000 $Wm^{-1}K^{-1}$, 1200 $Wm^{-1}K^{-1}$, or 1400 $Wm^{-1}K^{-1}$;
a tensile rupture strength with a nucleation face of the polycrystalline CVD diamond wafer in tension of: ≥760 MPa×n for a thickness of 50 to 500 µm; ≥700 MPa×n for a thickness of 500 to 750 µm; ≥650 MPa×n for a thickness of 750 to 1000 µm; ≥600 MPa×n for a thickness of 1000 to 1250 µm; 550 MPa×n for a thickness of 1250 to 1500 µm; ≥500 MPa×n for a thickness of 1500 to 1750 µm; ≥450 MPa×n for a thickness of 1750 to 2000 µm; or 400 MPa×n for a thickness of ≥2000 µm, wherein multiplying factor n is 1.0, 1.1, 1.2, 1.4, 1.6, 1.8, or 2;
a tensile rupture strength with a growth face of the polycrystalline CVD diamond wafer in tension of: ≥330 MPa×n for a thickness of 50 to 500 µm; 300 MPa×n for a thickness of 500 to 750 µm; ≥275 MPa×n for a thickness of 750 to 1000 µm; ≥250 MPa×n for a thickness of 1000 to 1250 µm; ≥225 MPa×n for a thickness of 1250 to 1500 µm; ≥200 MPa×n for a thickness of 1500 to 1750 µm; ≥175 MPa×n for a thickness of 1750 to 2000 µm; or ≥150 MPa×n for a thickness of 2000 µm, wherein multiplying factor n is 1.0 1.1, 1.2, 1.4, 1.6, 1.8, or 2;
a single crystal diamond plate with a fracture stress no less than 750 MPa;
a surface flatness ≤20 µm, ≤10 µm, or 5 µm;
a top face grain size exceeding 2 µm, 3 µm, 5 µm, 7 µm, 10 µm, 13 µm, or 15 µm;
a bottom face grain size exceeding 0.5 µm, 1 µm, 2 µm, 3 µm, 5 µm, 7 µm, or 10 µm;
an optical absorption no more than 3.0 $cm^{-1}$, 2.5 $cm^{-1}$, 2.0 $cm^{-1}$, 1.5 $cm^{-1}$, 1.2 $cm^{-1}$, 1.0 $cm^{-1}$, 0.8 $cm^{-1}$, or 0.6 $cm^{-1}$; and
an electrical resistivity no less than $1 \times 10^{10}$ Ωcm, $3 \times 10^{10}$ Ωcm, $1 \times 10^{11}$ Ωcm, $3 \times 10^{11}$ Ωcm, or $1 \times 10^{12}$ Ωcm.

12. An electronic device component according to claim 1, wherein the diamond heat spreader is directly bonded to the support frame.

13. A heat spreading substrate for use in the electronic device component of claim 1, the heat spreading substrate comprising:
a support frame comprising a top surface, a bottom surface, and an opening extending between the top surface and bottom surface of the support frame; and
a diamond heat spreader comprising a wafer of synthetic diamond material having a top face and a bottom face, wherein the diamond heat spreader is bonded to the support frame so that the diamond heat spreader extends across the opening in the support frame, wherein the support frame is formed of an electrically insulating ceramic material, wherein a metallization layer is disposed on the top surface of the support frame and on the top face of the diamond heat spreader, and wherein the top face of the diamond heat spreader is co-planar with the top surface of the support frame to within 500 μm.

* * * * *